United States Patent [19]

Blair

[11] Patent Number: 4,647,862

[45] Date of Patent: Mar. 3, 1987

[54] TRIGGER HOLDOFF SYSTEM FOR A DIGITAL OSCILLOSCOPE

[75] Inventor: Bruce W. Blair, Beaverton, Oreg.

[73] Assignee: Tektronix, Inc., Beaverton, Oreg.

[21] Appl. No.: 647,004

[22] Filed: Sep. 4, 1984

[51] Int. Cl.$^4$ .......................... H03K 4/10; H03K 4/86
[52] U.S. Cl. ................................... 328/109; 328/115;
328/72; 328/60; 328/181; 364/487; 307/228;
307/265; 307/518; 307/597; 307/351
[58] Field of Search ................. 328/15, 109, 181, 115,
328/72, 74, 60, 59, 69; 307/592, 597, 596, 262,
518, 528, 351, 355, 603, 265, 228; 364/487

[56] References Cited

U.S. PATENT DOCUMENTS

| | | | |
|---|---|---|---|
| 3,061,788 | 10/1962 | Kobbe | 328/196 |
| 3,851,262 | 11/1974 | Hohmann et al. | 328/185 |
| 4,359,649 | 11/1982 | Mundel | 307/268 |
| 4,404,481 | 9/1983 | Ide et al. | 307/491 |
| 4,495,642 | 1/1985 | Zellmer | 328/1 |

Primary Examiner—Stanley D. Miller
Assistant Examiner—Richard Roseen
Attorney, Agent, or Firm—George T. Noe

[57] ABSTRACT

A trigger holdoff system particularly useful in digital oscilloscopes is provided in which a holdoff pulse is generated in response to a trigger pulse from a trigger generator and applied to the trigger generator to disable a time base control circuit.

4 Claims, 4 Drawing Figures

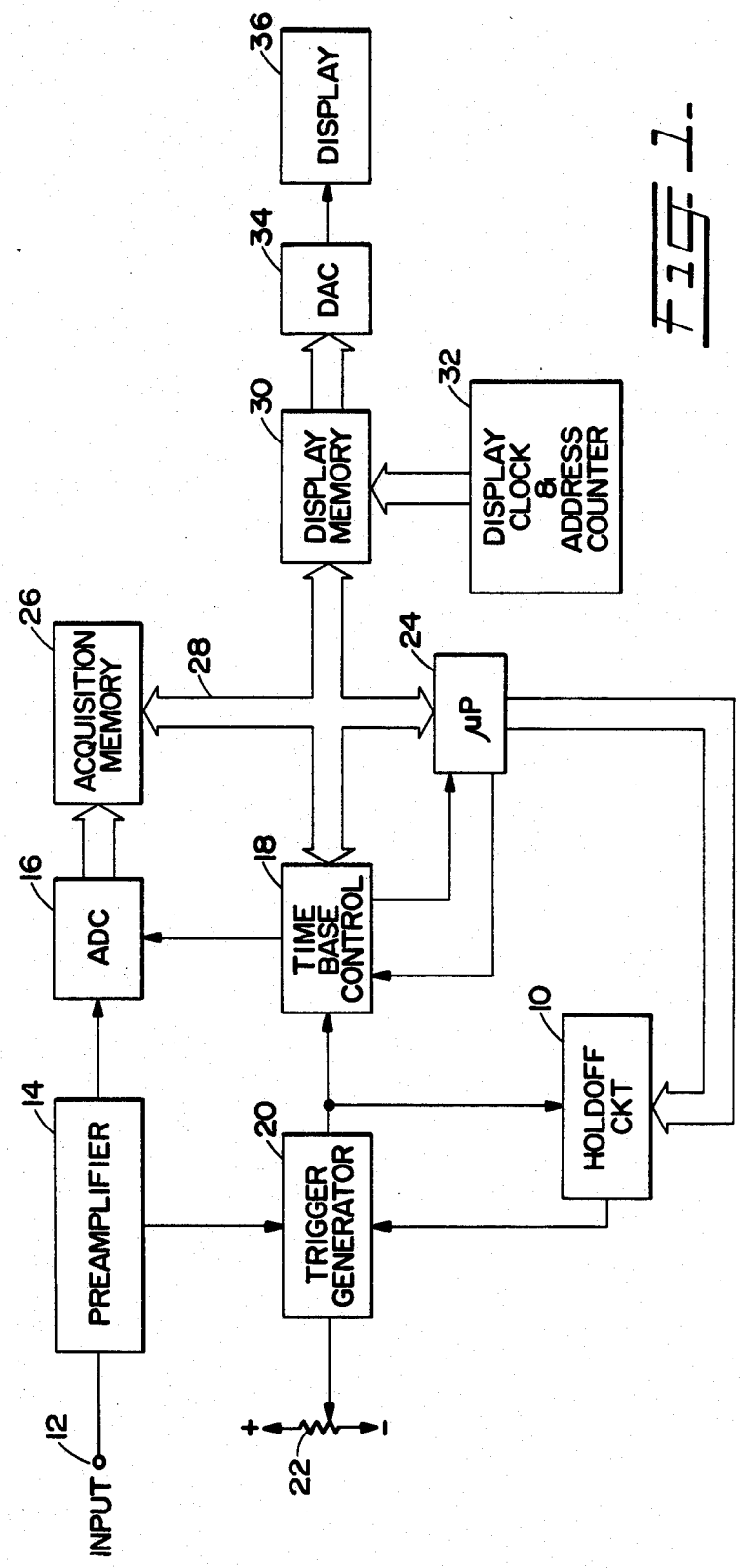

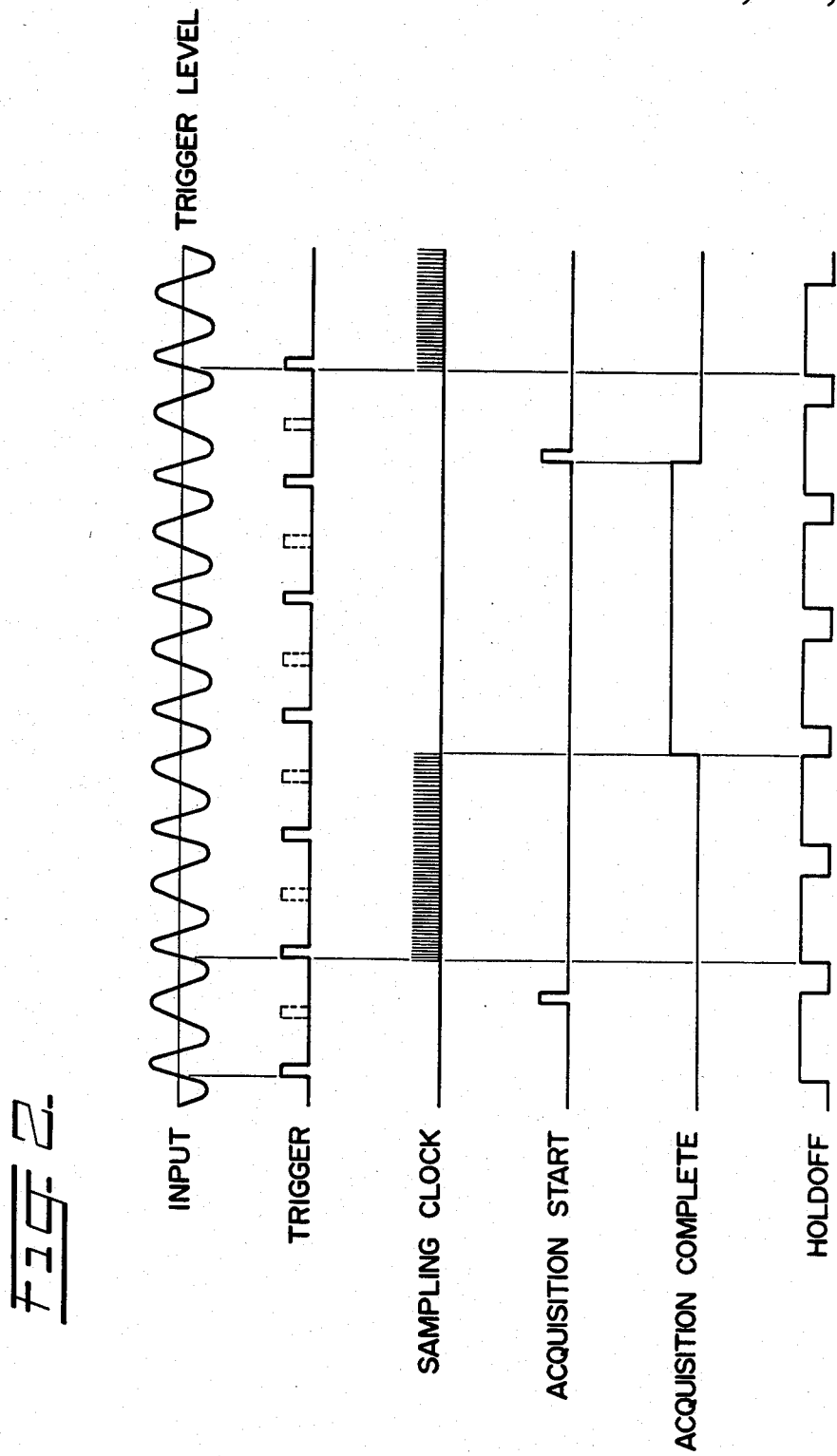

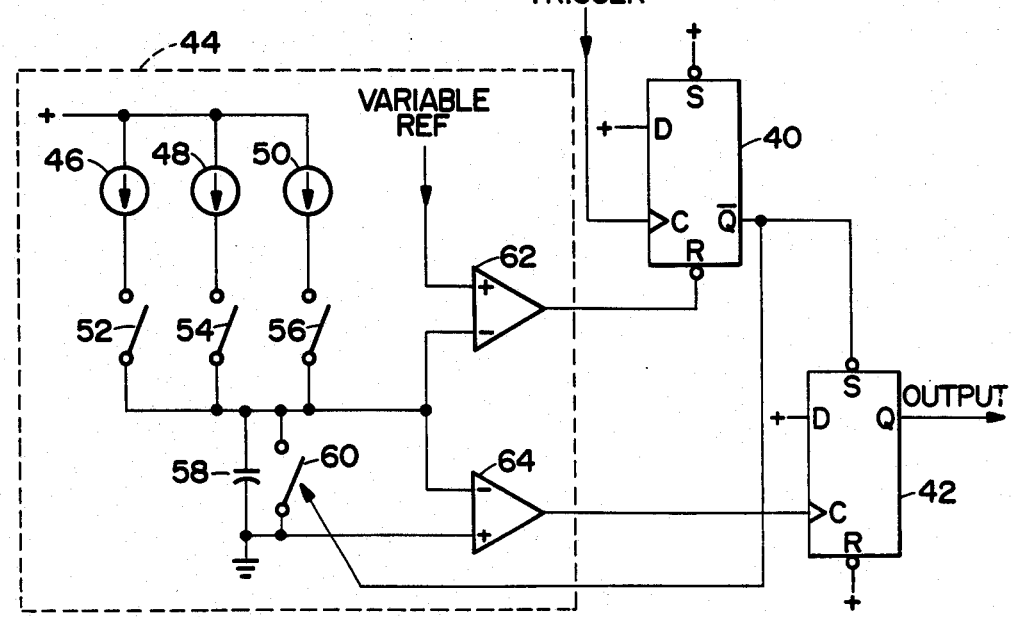
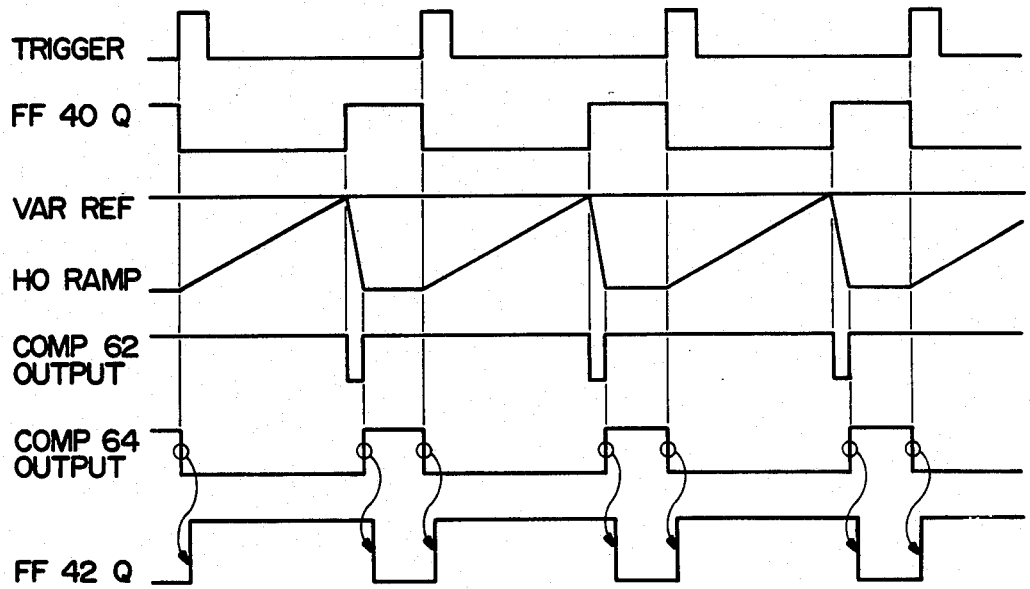

TRIGGER HOLDOFF SYSTEM FOR A DIGITAL OSCILLOSCOPE

BACKGROUND OF THE INVENTION

The present invention relates generally to trigger holdoff systems for oscilloscopes, and particularly to a trigger holdoff system for controlling the inhibit/enable cycle of the acquisition system of a digital oscilloscope.

In a digital storage oscilloscope, an input waveform is sampled at equally spaced time points along the time axis of the waveform, converted to digital data for storage, and displayed on a screen as an amplitude-versus-time waveform. That is, the input signal is sampled in response to a sampling clock and converted to digital data which is stored in a so-called acquisition memory under the control of a time-base control and address generator circuit. the input signal is also applied to a trigger generator which generates a trigger signal to be applied to the time-base control circuit. The time-base control circuit is enabled under control of a microprocessor and, when triggered, initiates an acquisition cycle to fill an acquisition memory.

After completion of the acquisition cycle, the acquired waveform is transferred to a display memory under control of the microprocessor. the microprocessor suitably may also process the waveform data for producing interpolation data, jitter correction and perhaps other waveform refinements, with the processed result being sent to the display memory. When such processes are completed, the microprocessor enables the time-base control circuit again to allow it to respond to another trigger from the trigger generator. However the acquisition cycle may not begin at the identical trigger point on the input signal because the processing time of the microprocessor varies, depending upon such factors as the kind of process and the number of processes. Therefore, if repetitious acquisition-and-display cycles are employed, the waveform displayed on the screen is unstable. This is particularly noticeable at the higher sweep speeds.

SUMMARY OF THE INVENTION

In accordance with the present invention, a holdoff system for a digital oscilloscope allows an acquisition cycle to start at an identical trigger point on an input waveform, thereby permitting a stable waveform display. This is achieved by generating a holdoff pulse, in response to a desired trigger signal, which holdoff pulse is applied to the trigger generator to lock out further trigger signals from the time base control circuit for a certain period of time. the holdoff pulse width may be variable so that the holdoff circuit may be adjusted to prevent the trigger circuit from generating an undesired trigger signal before the next desired trigger signal. The trigger generator and holdoff systems are allowed to free run independent of the acquisition system. Trigger and holdoff cycles run continuously to emulate a conventional (analog) oscilloscope with variable holdoff, and the digital system samples from the stream of triggers only when it is ready to accept a trigger. Thus, the digital oscilloscope incorporating the holdoff system of the present invention displays a subset of the sweeps that a conventional oscilloscope would display, and the holdoff interval is the same as that in the conventional oscilloscope.

It is therefore one feature of the present invention to provide a trigger holdoff system for a digital oscilloscope which permits waveform acquisition to start at identical trigger points on repetitive input signals.

It is another feature of the present invention to provide a trigger holdoff system which is allowed to free run independent of the acquisition system of the digital storage.

Other features and attainments of the present invention will become apparent to those skilled in the art upon a reading of the following detailed description when taken in conjunction with the drawings.

DRAWINGS

FIG. 1 is a block diagram of a digital oscilloscope employing a trigger holdoff circuit in accordance with the present invention;

FIG. 2 is a waveform diagram to facilitate an understanding of the operation of the digital oscilloscope of FIG. 1;

FIG. 3 is a circuit diagram of a preferred embodiment of the trigger holdoff circuit of the present invention; and FIG. 4 is a waveform diagram to facilitate an understanding of the operation of the trigger holdoff circuit of FIG. 3.

DETAILED DESCRIPTION OF THE INVENTION

Referring to the block diagram of FIG. 1, a digital oscilloscope employs trigger holdoff circuit 10. The operation of the embodiment of FIG. 1 will be described in connection with the waveforms of FIG. 2, which depicts the relationship between signals. An analog signal (INPUT) is applied via input terminal 12 to preamplifier 14, which suitably may be a conventional gain switching amplifier for amplifying and attenuating the input signal to a suitable level. The preamplified signal is applied to analog-to-digital converter (ADC) 16, which converts the instantaneous value of the analog signal to n-bit parallel digital data at a rate determined by a sampling clock applied from time base control 18.

the analog signal is also applied to trigger generator 20, which generates a trigger signal (TRIG) at a variable reference level determined by a trigger level potentiometer 22. The trigger signal is applied to time base control circuit 18, which also receives an acquisition start signal (ACQ START) from microprocessor 24 to enable time base control circuit 18. After being enabled by the acquisition start signal, time base control circuit 18 sends a sampling clock signal to ADC 16 in response to initiation by the trigger pulse. Simultaneously, the sampling clock is counted by an address counter within time base control circuit 18. The address counter may be preset with a predetermined number to provide either pre-triggered or post-triggered operation. The n-bit digital data is clocked into acquisition memory 26 according to addresses designated via bus 28 by the address counter, as is well known in the art.

When the address counter reaches a count of the maximum address, time base control circuit 18 provides an acquisition complete signal (ACQ COMPLETE) to microprocessor 24, which in turn disables time base control circuit 18. Then the acquired waveform data is transferred from acquisition memory 26 to display memory 30. Microprocessor 24 reads the data from display memory 30 and processes it to measure amplitude and frequency, produce interpolated data etc. Display memory 30 is loaded with data representing a waveform by microprocessor 24 via bus 28. Now microprocessor 24 is free to start another waveform acquisition and provide an acquisition start signal again to time base control circuit 18. The stored data is clocked out of memory 30 under control of the display clock-/address counter 32, converted to an analog signal by digital-to-analog converter (DAC) 34 and displayed on the vertical axis of display device 36.

The trigger signal (TRIG) produced by trigger generator 20 is also applied to trigger holdoff circuit 10 which produces holdoff pulses responsive to the leading edge of the trigger signals in this embodiment. The holdoff pulse signal is applied to a reset input terminal of trigger generator 20 to inhibit further triggers, indicated by the dotted trigger signal in FIG. 2, while the holdoff signal is in high state. The time interval of the high state is programmable by microprocessor 24 via bus 38 and trigger generator 20 may provide identical trigger pulses to time base control circuit 18 by adjusting the time interval of the holdoff pulse. Therefore, acquisition memory 24 starts data aquisition at the identical point on every acquisition cycle even if the processing time of microprocessor 24 is variable. Accordingly, repetitive waveforms displayed on display device 36 are stable.

FIG. 3 is a detailed schematic of one embodiment for generating a trigger holdoff signal in accordance with the present invention. The trigger signal is applied from trigger generator 20 to a clock input of D-type flip flop (FF) 40 which may suitably be a commercially available 74LS74 having $\bar{S}$ and D inputs connected to high levels. A $\bar{Q}$ output of D-type FF 40 is connected to the $\bar{S}$ input of D-type FF 42, which may be the same as D-type FF 40 having $\bar{R}$ and D inputs connected to high levels. Programmable timing circuit 44 includes current sources 46, 48 and 50, programmable switches 52, 54 and 56, timing capacitor 58, timing switch 60 and comparators 62 and 64. Switches 52, 54 and 56 are connected between each of current sources 46, 48 and 50 and timing capacitor 52.

Timing switch 60 is connected across capacitor 58 and controlled by the $\bar{Q}$ output of D type FF 40. The voltage ramp across capacitor 58 is made variable by programming switches 52, 54 and 56. The junction of the switches and capacitor 58 is connected to the inverted inputs of comparators 62 and 64 having non-inverting inputs respectively connected to a variable reference level and a ground potential, and having outputs respectively connected to the $\bar{R}$ input of D-type FF 40 and the clock input of D-type FF 42.

The operation of the circuit of FIG. 3 will be described in conjunction with FIG. 4 which shows timing relation between the signals. The trigger signal applied to the clock input of D type FF 40 causes the $\bar{Q}$ output thereof to go low, thereby opening switch 60. The programmed current from the current source group linearly charges capacitor 58 to produce a voltage ramp signal. The voltage ramp signal causes the output of comparator 64 to go low, thereby causing a Q output of D type FF 42 (holdoff signal) to go high. Comparator 62 compares the voltage level of the ramp signal with the variable reference level and provides a high level output while the variable reference level is higher than the voltage level of the ramp signal. When the voltage ramp signal reaches the reference level, comparator 62 provides a low level pulse to the $\bar{R}$ input, thereby causing the Q output of D type FF 40 to go high. The high level output from D type FF 40 closes switch 60 to discharge capacitor 58 rapidly. When the voltage ramp goes to zero, the output of comparator 64 goes high, thereby causing the holdoff signal to go low. The holdoff signal is applied to trigger generator 20 to prevent it from generating triggers during the high level period of the holdoff signal. The next trigger causes the $\bar{Q}$ output of FF 40 to go high and the above-described operation will be repeated.

It will therefore be appreciated that the aforementioned and other desirable objects have been achieved; however, it should be noted that the particular embodiment of the invention which is shown and described herein is intended as merely illustrative and not as restrictive of the invention. For example, the timing circuit 44 could be implemented digitally using a programmable counter and variable clock, as well as a one shot multivibrator with variable capacitors and resistors.

What we claim as novel is:

1. A trigger holdoff system for a digital oscilloscope, comprising:
    a trigger generator for generating a trigger pulse at a preselected point on a signal input waveform;
    a digital time base control circuit responsive to said trigger pulse for generating sample clock pulses;
    sampling means responsive to said sample clock pulses for sampling said signal input waveform; and
    a holdoff circuit for generating a holdoff pulse in response to said trigger pulse to inhibit further trigger pulses from said trigger generator for a preselectable time duration.

2. A trigger holdoff system in accordance with claim 1, wherein said holdoff circuit includes a first logic circuit for receiving said trigger pulses, a timing circuit for generating a pulse having a programmable duration and a second logic circuit for generating said holdoff pulse in response to the outputs of said first logic circuit and said timing circuit.

3. A trigger holdoff system in accordance with claim 2, wherein said first and second logic circuits are flip flops.

4. A trigger holdoff system in accordance with claim 2, wherein said timing circuit includes a programmable current source, a timing capacitor charged by said programmable current source, a timing switch means connected across said timing capacitor, and comparators for receiving a voltage ramp signal across said timing capacitor.

* * * * *